(12) United States Patent
Alshinnawi et al.

(10) Patent No.: US 9,173,320 B2
(45) Date of Patent: Oct. 27, 2015

(54) TARGETED COOLING TO SPECIFIC OVERHEATING RACK-MOUNTED SERVERS

(71) Applicant: Lenovo Enterprise Solutions (Singapore) Pte. Ltd., Singapore (SG)

(72) Inventors: Shareef F. Alshinnawi, Durham, NC (US); Gary D. Cudak, Creedmoor, NC (US); Edward S. Suffern, Chapel Hill, NC (US); J. Mark Weber, Wake Forest, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 359 days.

(21) Appl. No.: 13/765,369

(22) Filed: Feb. 12, 2013

(65) Prior Publication Data

US 2014/0226280 A1     Aug. 14, 2014

(51) Int. Cl.
*G05D 23/00*    (2006.01)
*H05K 7/20*    (2006.01)

(52) U.S. Cl.
CPC ........ *H05K 7/20145* (2013.01); *H05K 7/20736* (2013.01); *H05K 7/20836* (2013.01)

(58) Field of Classification Search
None
See application file for complete search history.

(56) References Cited

U.S. PATENT DOCUMENTS

| | | | |
|---|---|---|---|
| 248,732 A | 10/1881 | Garratt | |
| 4,612,979 A | 9/1986 | Heitzig | |
| 5,636,103 A | 6/1997 | Bushner | |
| 7,352,575 B2 * | 4/2008 | Anderl et al. | 361/695 |
| 7,450,377 B2 | 11/2008 | Matsumoto et al. | |
| 7,639,499 B1 | 12/2009 | Campbell et al. | |
| 7,746,634 B2 | 6/2010 | Hom et al. | |
| 7,907,402 B2 | 3/2011 | Caveney | |
| 7,944,694 B2 | 5/2011 | Campbell et al. | |
| 7,961,475 B2 | 6/2011 | Campbell et al. | |
| 7,986,526 B1 | 7/2011 | Howard et al. | |
| 8,144,464 B2 | 3/2012 | Vanderveen et al. | |
| 8,154,870 B1 | 4/2012 | Czamara et al. | |
| 8,257,155 B2 | 9/2012 | Lewis, II | |

(Continued)

FOREIGN PATENT DOCUMENTS

DE        10311380 A1    10/2003

OTHER PUBLICATIONS

Inova Products Inc., "The Activent: Wireless Temperature Controlled Air Vent System," Copyright 2009-2011, Inova Products Inc., pp. 1-3, Retrieved Feb. 18, 2013, <http://www.theactivent.com>.

(Continued)

*Primary Examiner* — Sean Shechtman
(74) *Attorney, Agent, or Firm* — Law Office of Jim Boice

(57) ABSTRACT

In one embodiment of the present invention, a system selectively cools a set of at least one rack-mounted server in a chassis. The system comprises: a chassis; a chassis manager; a set of at least one thermal sensor coupled to each rack-mounted server in a chassis; a trolley track oriented functionally proximate to the multiple rack-mounted servers; and a cold air trolley movably mounted to the trolley track. The cold air trolley moves along the trolley track in order to be selectively oriented next to a particular overheating rack-mounted server in the chassis, thus providing a fluid conduit from a cold air source to the particular overheating rack-mounted server in response to the chassis manager detecting that the particular overheating rack-mounted server is exceeding a predetermined temperature.

17 Claims, 6 Drawing Sheets

(56) References Cited

U.S. PATENT DOCUMENTS

| | | | |
|---|---|---|---|
| 2004/0217072 A1* | 11/2004 | Bash et al. | 211/26 |
| 2004/0218355 A1 | 11/2004 | Bash et al. | |
| 2004/0264124 A1* | 12/2004 | Patel et al. | 361/686 |
| 2005/0237716 A1 | 10/2005 | Chu et al. | |
| 2008/0002362 A1 | 1/2008 | Ishimine | |
| 2008/0239659 A1 | 10/2008 | Kundapur | |
| 2009/0308093 A1 | 12/2009 | Khalili et al. | |
| 2010/0103614 A1 | 4/2010 | Campbell et al. | |
| 2010/0313590 A1 | 12/2010 | Campbell et al. | |
| 2010/0315788 A1 | 12/2010 | Vanderveen et al. | |
| 2011/0205705 A1 | 8/2011 | Graybill et al. | |
| 2011/0290448 A1 | 12/2011 | Campbell et al. | |
| 2011/0315353 A1 | 12/2011 | Campbell et al. | |

OTHER PUBLICATIONS

Anonymous, "Kwikduct Product Sheet," KC Amalgamated, LLC, pp. 1, Retrieved Feb. 18, 2013, <http://kwikduct.com/documents.htm>.

Anonymous, "Liebert XDV, XD Racktop Cooling Module, 8.8-10KW," Emerson Network Power, pp. 1, Retrieved Feb. 18, 2013, <http://www.emersonnetworkpower.com/en-US/Products/PrecisionCooling/ HighDensityModularCooling/Refrigerant-Based/Pages/LiebertXDV.aspx>.

U.S. Appl. No. 13/684,738, filed Nov. 26, 2012—Specification and Drawings.

U.S. Appl. No. 13/778,656—Non-Final Office Action Mailed April 8, 2015.

* cited by examiner

TARGETED COOLING TO SPECIFIC OVERHEATING RACK-MOUNTED SERVERS

BACKGROUND

The present disclosure relates to the field of computers, and specifically to rack-mounted computers in a chassis. Still more particularly, the present disclosure relates to cooling rack-mounted computers in a chassis.

A chassis is a housing that holds multiple rack-mounted computers, also known as servers, also known as rack-mounted servers. Each rack-mounted server is an autonomous or semi-autonomous computing system, which is able to communicate with other rack-mounted servers within and outside of the chassis.

SUMMARY

In one embodiment of the present invention, a system selectively cools a set of at least one rack-mounted server in a chassis. The system comprises: a chassis; a chassis manager; a set of at least one thermal sensor coupled to each rack-mounted server in a chassis; a trolley track oriented functionally proximate to the multiple rack-mounted servers; and a cold air trolley movably mounted to the trolley track. The cold air trolley moves along the trolley track in order to be selectively oriented next to a particular overheating rack-mounted server in the chassis, thus providing a fluid conduit from a cold air source to the particular overheating rack-mounted server in response to the chassis manager detecting that the particular overheating rack-mounted server is exceeding a predetermined temperature.

In one embodiment of the present invention, a method and/or computer program product selectively cools a set of at least one rack-mounted server in a chassis. A thermal reading is received from a set of at least one thermal sensor coupled to each rack-mounted server in a chassis, where the set of at least one thermal sensor communicates a real time temperature of each rack-mounted server from the multiple rack-mounted servers to the chassis manager. One or more processors detects that a particular overheating rack-mounted server from the multiple rack-mounted servers is exceeding a predetermined temperature. One or more processors repositions a cold air trolley to the particular overheating rack-mounted server, wherein the cold air trolley is movably mounted on a trolley track that is oriented functionally proximate to the multiple rack-mounted servers, wherein the trolley track is functionally proximate if oriented in a position that allows cold air trolleys to selectively deliver cold air to one or more of the multiple rack-mounted servers, wherein the cold air trolley moves along the trolley track in order to be selectively oriented next to a particular overheating rack-mounted server in the chassis, and wherein the cold air trolley provides a fluid conduit from a cold air source to the particular overheating rack-mounted server in response to the chassis manager detecting that the particular overheating rack-mounted server is exceeding a predetermined temperature.

DETAILED DESCRIPTION

As will be appreciated by one skilled in the art, some or all of the present disclosure may be embodied as a system, method or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, some or all of the features described in the present disclosure may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Figure 1:
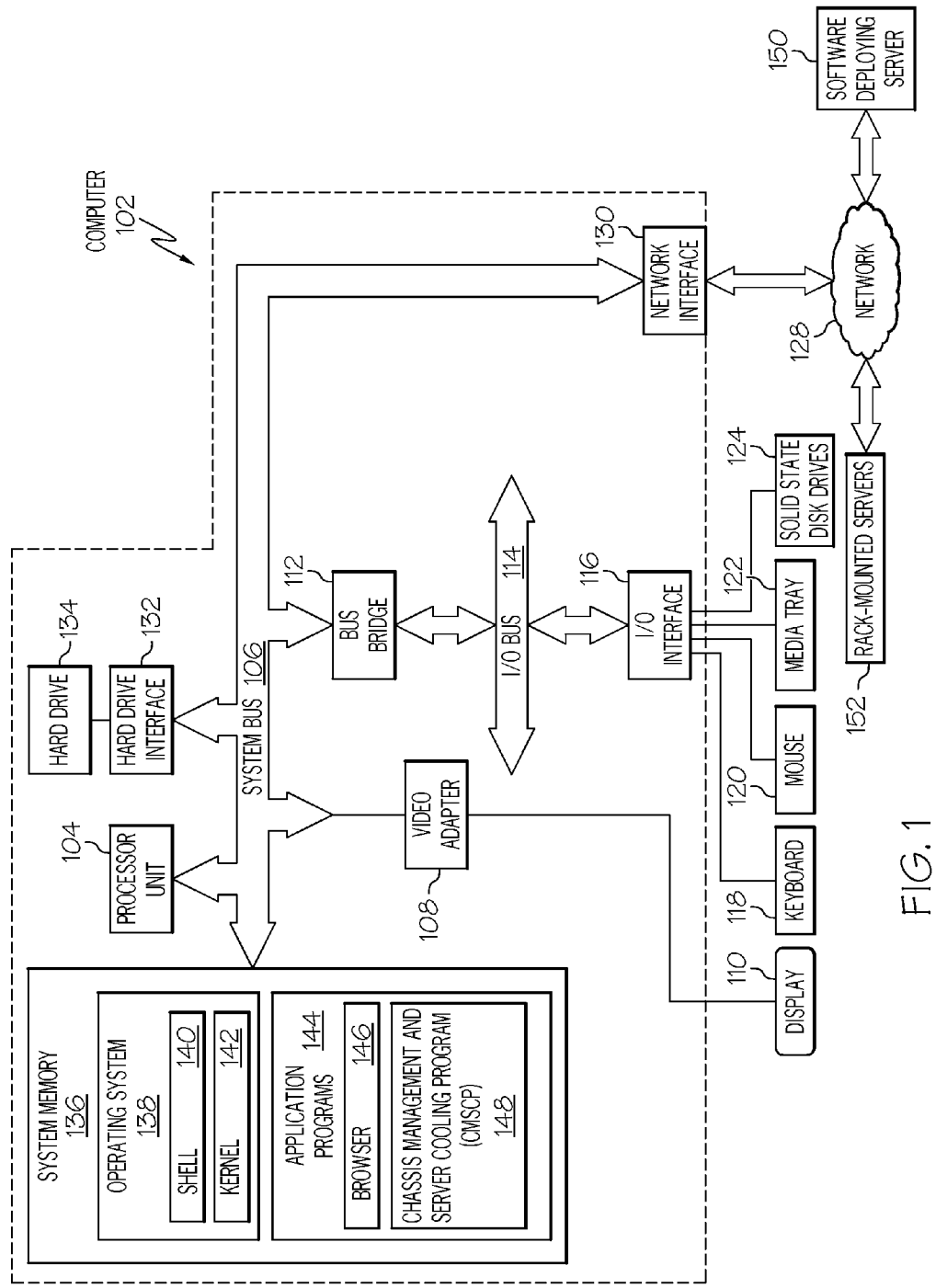
FIG. 1 depicts an exemplary computer that may be used in implementing one or more components described in the present disclosure.
Figure 2:
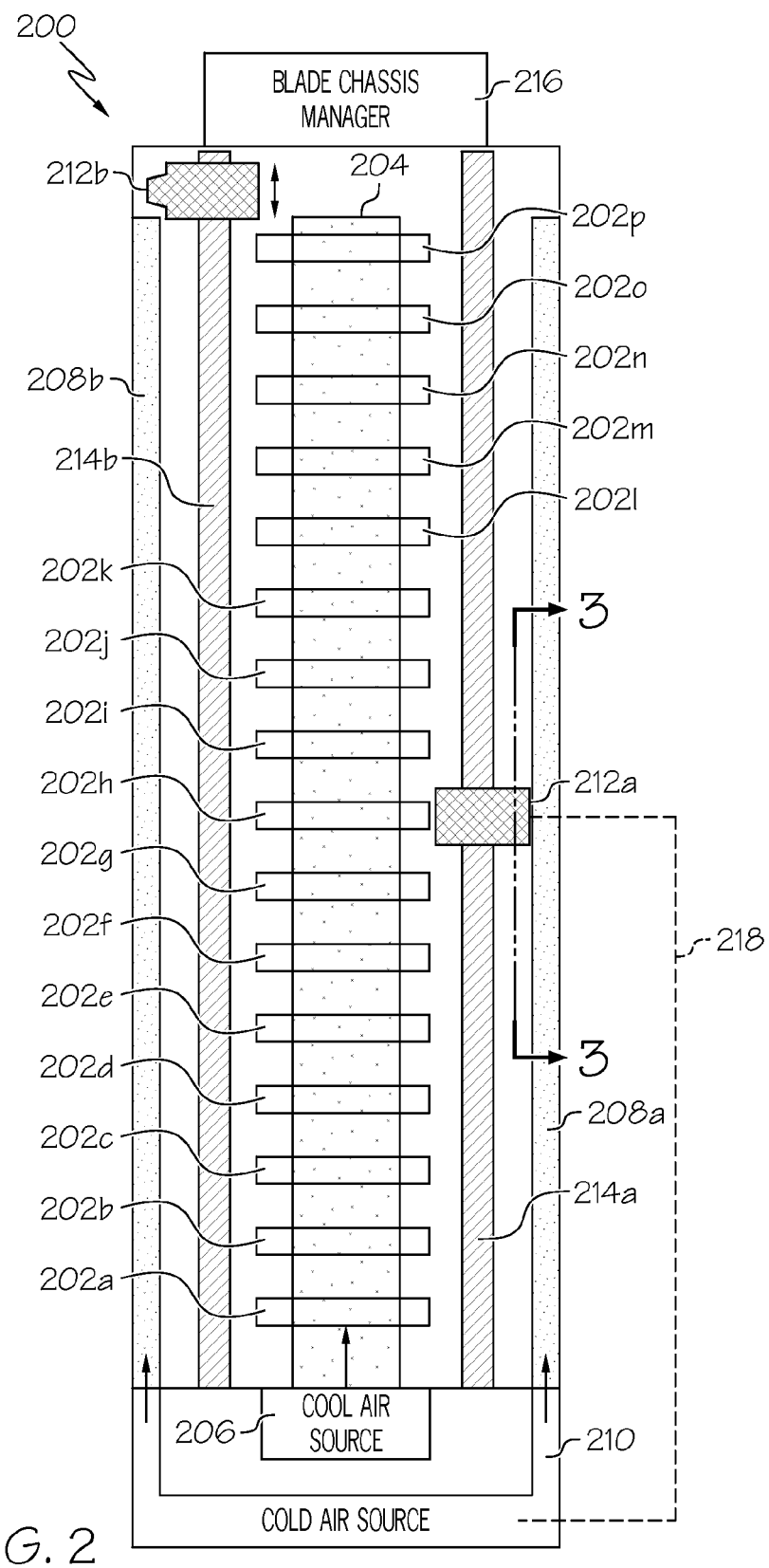
FIG. 2 illustrates an exemplary chassis in which overheating rack-mounted servers are targeted for auxiliary cooling in accordance with the present invention.

With reference now to the figures, and in particular to FIG. 1, there is depicted a block diagram of an exemplary computer 102, which may be utilized by the present disclosure to manage multiple rack-mounted servers by acting as a chassis manager, which is a processor-based computing system (e.g., that comprises one or more processors) such as chassis manager 216 depicted in FIG. 2. Thus, the architecture depicted in FIG. 1 for computer 102 may be utilized in software deploying server 150 and/or rack-mounted servers 152 and/or chassis manager 216.

Computer 102 includes a processor unit 104 that is coupled to a system bus 106. Processor unit 104 may utilize one or more processors, each of which has one or more processor cores. A video adapter 108, which drives/supports a display 110, is also coupled to system bus 106. System bus 106 is coupled via a bus bridge 112 to an input/output (I/O) bus 114. An I/O interface 116 is coupled to I/O bus 114. I/O interface 116 affords communication with various I/O devices, including a keyboard 118, a mouse 120, a media tray 122 (which may include storage devices such as CD-ROM drives, multimedia interfaces, etc.), and high-speed solid state disk drives 124. While the format of the ports connected to I/O interface 116 may be any known to those skilled in the art of computer architecture, in a preferred embodiment some or all of these ports are universal serial bus (USB) ports.

As depicted, in one embodiment, computer 102 is able to communicate via network 128 using a network interface 130. Network 128 may be an external network such as the Internet, or an internal network such as an Ethernet or a virtual private network (VPN). Network 128 provides a communication link to external computing devices, such as software deploying server 150 and/or rack-mounted servers 152.

A hard drive interface 132 is also coupled to system bus 106. Hard drive interface 132 interfaces with a hard drive 134. In a preferred embodiment, hard drive 134 populates a system memory 136, which is also coupled to system bus 106. System memory is defined as a lowest level of volatile memory in computer 102. This volatile memory includes additional higher levels of volatile memory (not shown), including, but not limited to, cache memory, registers and buffers. Data that populates system memory 136 includes computer 102's operating system (OS) 138 and application programs 144.

OS 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present disclosure will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management.

Application programs 144 include a renderer, shown in exemplary manner as a browser 146. Browser 146 includes program modules and instructions enabling a world wide web (WWW) client (i.e., computer 102) to send and receive network messages to the Internet using hypertext transfer protocol (HTTP) messaging, thus enabling communication with software deploying server 150 and other described computer systems.

Application programs 144 also include a chassis management and server cooling program (CMSCP) 148, which, when executed, performs some or all of the processes described in FIGS. 2-6. In one embodiment, CMSCP 148 is downloadable from software deploying server 150 in an on-demand basis, such that units of code are downloaded only when needed. In another embodiment, some or all of the processes executed by CMSCP 148 are performed by software deploying server 150 itself, thus minimizing the use of resources within computer 102.

The hardware elements depicted in computer 102 are not intended to be exhaustive, but rather are representative to highlight essential components required by the present disclosure. For instance, computer 102 may include alternate memory storage devices such as magnetic cassettes, digital versatile disks (DVDs), Bernoulli cartridges, and the like. These and other variations are intended to be within the spirit and scope of the present disclosure.

With reference now to FIG. 2, an exemplary chassis 200 in which overheating rack-mounted servers are targeted for auxiliary cooling in accordance with the present invention is presented. Chassis 200 holds multiple rack-mounted servers, depicted as rack-mounted servers 202a-202p (where "p" is an integer). Positioned adjacent to the rack-mounted servers 202a-202p is a cool air plenum 204, which provides primary cooling air from a cool air source 206. In one embodiment, cool air plenum 204 is a semi-enclosed plenum within the chassis 200, which provides cooling air to the rack-mounted servers 202a-202p via passage holes (not shown) on at least one side of the cool air plenum 204. In another embodiment, cool air plenum 204 is ambient air within or adjacent to the chassis 200. In either embodiment, cool air is provided by a positive pressure source of cool air, depicted as cool air source 206, which provides primary cooling air to fans (not depicted) mounted on (e.g., on a heat sink) each of the rack-mounted servers 202a-202p, or adjacent to one or more (i.e., in a "zone") of the rack-mounted servers 202a-202p.

During normal (i.e., error-free) operation, the cooling air from the cool air plenum 204 is sufficient to keep the rack-mounted servers 202a-202p operating at nominal (normal) temperatures. However, occasionally one of the rack-mounted servers, such as rack-mounted server 202h, exceeds its nominal operating temperature. For example, a processor mounted to rack-mounted server 202h may be overheating, despite the availability of primary cooling air from the cool air plenum 204 and the heat sink/cooling fan(s) associated with rack-mounted server 202h. One solution to this overheating is to simply "turn up" the speed of the cooling fan(s) associated with rack-mounted server 202h. However, this results in a drop in static pressure and dynamic pressure within the cool air plenum 204, thus robbing rack-mounted servers 202g-202p of sufficient primary cooling air.

In order to avoid increasing the speed of the cooling fan(s) dedicated to cooling rack-mounted server 202h, the present invention utilizes auxiliary cold air plenums 208a-208b, which provide auxiliary cold air from a cold air source 210 (e.g., an air conditioning system that provides secondary cooling air). Note that while the cool air source 206 and the cold air source 210 both are air conditioning (i.e., air chilling) systems, the temperature of the air provided by these two sources may be the same as one another or different from one another.

Cold air from the cold air plenums 208a-208b is selectively directed to the overheating rack-mounted server 202h by cold air trolleys 212a-212b, which traverse up and down the interior of the chassis 200 on trolley tracks 214a-214b. As described herein, if the chassis manager 216 receives a signal (e.g., from a thermal sensor mounted on the overheating rack-mounted server 202*h*) indicating that rack-mounted server 202*h* is overheating, the chassis manager 216 (e.g., by executing instructions from CMSCP 148 depicted in FIG. 1) causes one or both of the cold air trolleys 212*a*-212*b* to be positioned adjacent to the overheating rack-mounted server 202*h*. As depicted, in one embodiment, only a single cold air trolley 212*a* is positioned in the zone of the overheating rack-mounted server 202*h*, leaving the other cold air trolley 212*b* in reserve for other problematic rack-mounted servers. Alternatively, the other cold air trolley 212*b* can be positioned next to the overheating rack-mounted server 202*h* if the first cold air trolley 212*a* alone is unable to bring the temperature of the overheating rack-mounted server 202*h* down to an acceptable level.

Note that cold air trolleys 212*a*-212*b* are moved along the trolley tracks 214*a*-214*b*, under the direction of the chassis manager 216, by cables, rack and pinion systems, resident motors (i.e., within the cold air trolleys 212*a*-212*b*) or any other mechanical means of motion and/or locomotion.

Figure 3:
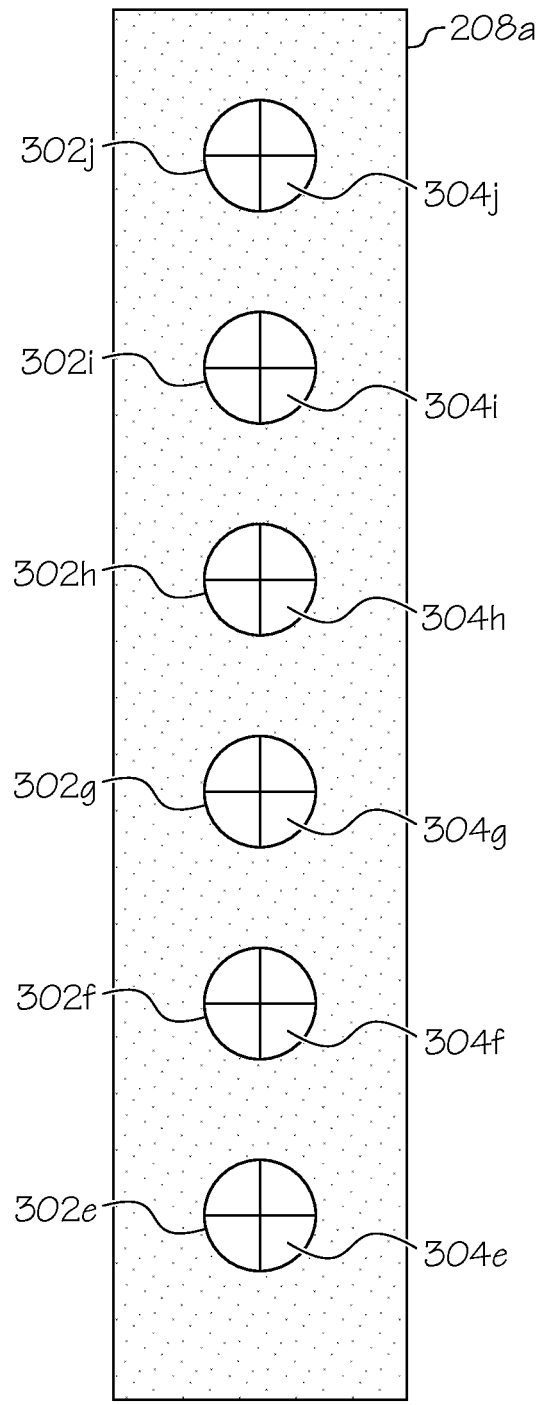
FIG. 3 depicts additional detail of a cold air plenum illustrated in FIG. 2.

With reference to FIG. 3, additional detail of the identified section of cold air plenum 208*a* is presented. As depicted in FIG. 3, cold air plenum 208*a* has a series of orifices (including the depicted orifices 302*e*-302*j*), which align with respective rack-mounted servers 202*e*-202*j*. Each of the orifices is occluded with a flexible occlusion flap, shown as respective occlusion flaps 304*e*-304*j*. These occlusion flaps 304*e*-304*j* may be hinged flaps, slit material (as depicted), irises (i.e., material that normally occludes the orifice, but can be axially/radially unfurled to present an opening), or any other configuration of material that has a "memory" (i.e., returns to its original shape to occlude the orifice after being pushed open). For example, assume that the occlusion flap 304*h* has two slits, as depicted. If a tube, probe, nozzle, etc. is pushed against/through the occlusion flap 304*h*, it will open up to accommodate the nozzle that is being pushed through it. Once the nozzle is withdrawn, however, the occlusion flap 304*h* returns to its original shape, and thus re-occludes the orifice 302*h*. The material that is used to construct the occlusion flaps (including the occlusion flaps for other orifices on the cold air plenums 208*b*-208*c* in FIG. 2) may be any suitable memory material, including rubber, nanocarbon material, flexible plastic, etc.

Figure 4:
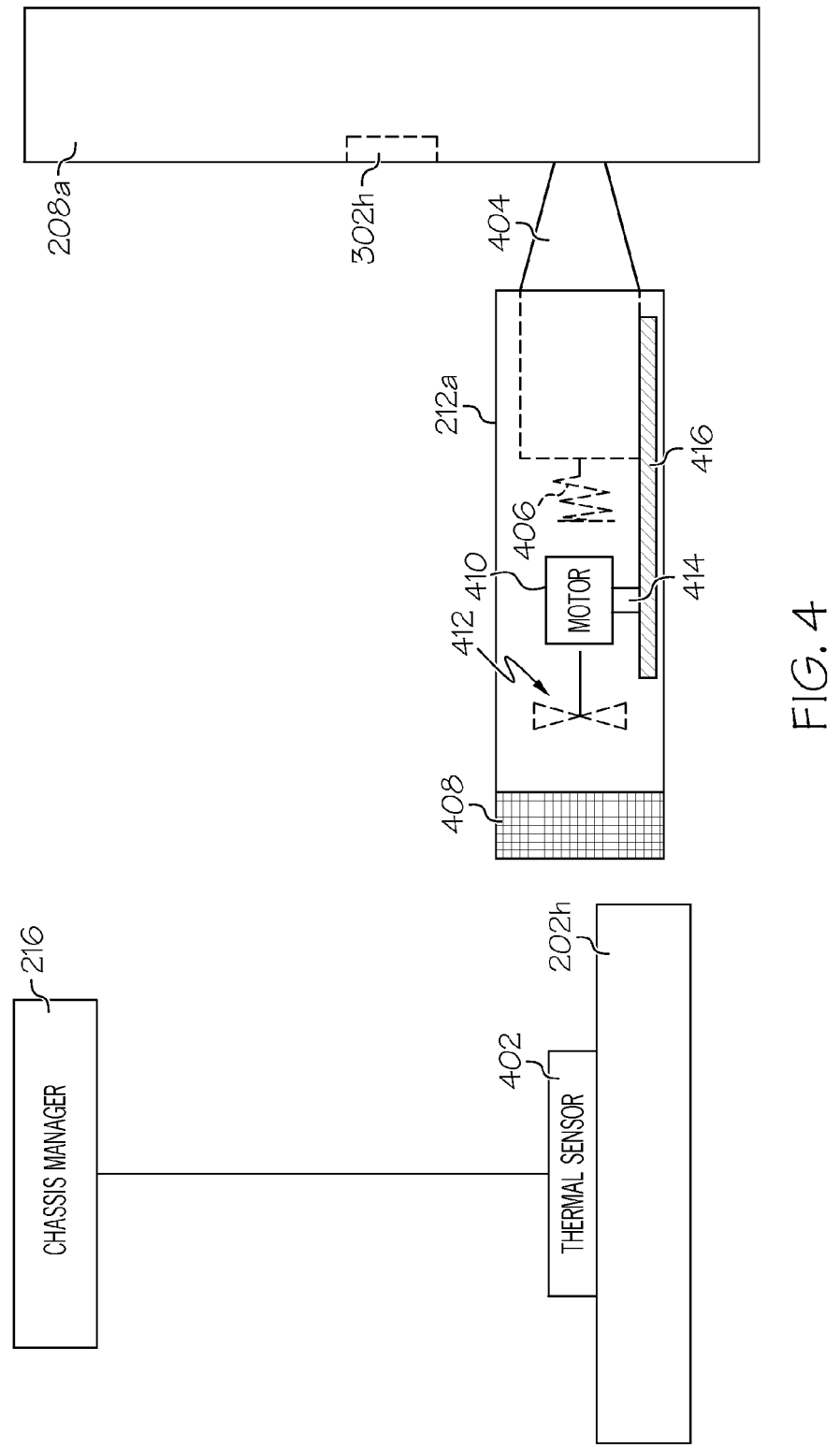
FIG. 4 illustrates a cold air trolley before it penetrates the cold air plenum illustrated in FIG. 2.

With reference to FIG. 4, additional detail of cold air trolley 212*a* (shown in FIG. 2) is presented. Assume that a thermal sensor 402, which is mounted on overheating rack-mounted server 202*h*, has sent a signal to chassis manager 216, indicating that rack-mounted server 202*h* is overheating. Chassis manager 216 then causes cold air trolley 212*a* to align adjacent to (or just above, just below, etc.) the overheating rack-mounted server 202*h*. As depicted in FIG. 4, the cold air trolley 212*a* has not yet reached its destination, since its movable nozzle 404 is not yet in position to penetrate orifice 302*h* (via its respective occlusion flap 304*h*).

Figure 5:
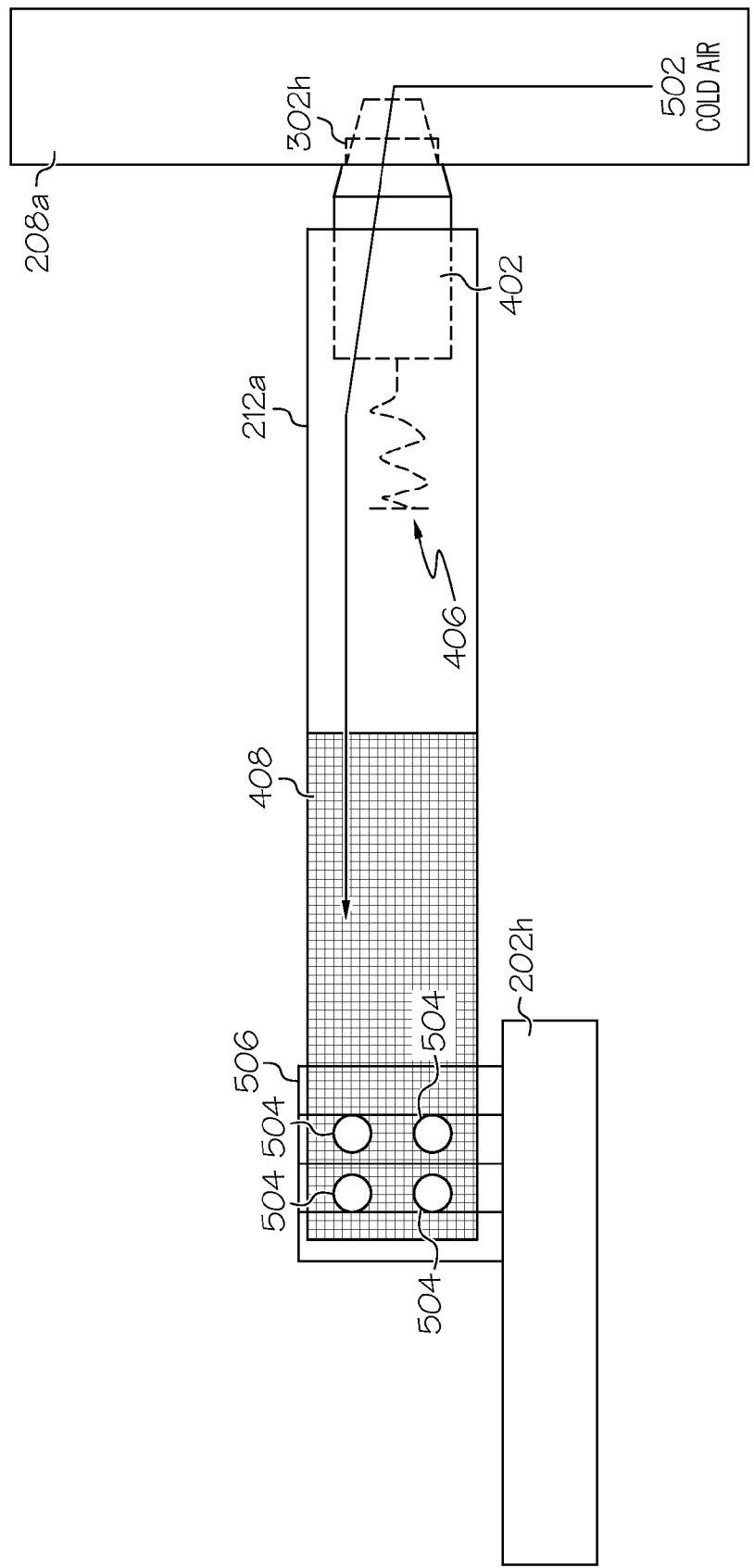
FIG. 5 depicts the cold air trolley after it penetrates the cold air plenum illustrated in FIG. 2.

As depicted in FIG. 4, in one embodiment the movable nozzle 402 is spring-loaded with a compressed spring 406. When the cold air trolley 212*a* aligns with the orifice 302*h* (as depicted in FIG. 5), the spring 406 pushes the nozzle 404 into the orifice 302*h*, allowing cold air to flow through the nozzle 404 and into the cold air trolley 212*a* (which has an interior cavity). Note that in FIG. 4, there is no air flowing from cold air plenum 208*a* into the interior of cold air trolley 212*a*. In this stage, an expandable tube of flexible memory material 408 is not expanded. That is, expandable tube of flexible memory material 408 is essentially like an accordion balloon that has not yet been inflated. However, as depicted in FIG. 5, as soon as nozzle 402 penetrates orifice 302*h*, cold air 502 flows through the interior of cold air trolley 212*a* and inflates (expands) the expandable tube of flexible memory material 408. This causes holes 504 to open up, allowing the cold air 502 to be precisely directed to an area (e.g., the processor's heat sink 506) on the overheating rack-mounted server 202*h*.

Returning to FIG. 4, note that in one embodiment, the cold air trolley 212*a* includes an internal motor 410. This motor 410 (e.g., a small electric motor) can drive a fan 412, which provides additional negative pressure to pull in cold air from the cold air plenum 208*a* once the nozzle has penetrated the orifice 302*h*. In addition, or in the alternative, the motor 410 can drive a pinion gear 414, which is mechanically mated to a rack 416, which is mounted to the movable nozzle 404. That is, in one embodiment, the sloped edges of the spring-loaded nozzle 404 causes the nozzle 404 to penetrate every orifice along the side of the cold air plenum 208*a* as the cold air trolley 212*a* is traveling to its intended destination (as depicted in FIG. 5), and then to slide out of the orifice as the cold air trolley 212*a* continues past such orifices. This provides a simple construction of the cold air trolley 212*a*, but will wear out the flexible occlusion flaps (e.g., occlusion flap 304*h* depicted in FIG. 3) if overused (i.e., if the cold air trolleys 212*a*-212*b* travel up and down the trolley tracks 214*a*-214*b* too often). Thus, by removing the spring 406 and just utilizing the mechanical system afforded by the motor 410, rack 416, and pinion gear 414, the chassis manager 216 can selectively direct the nozzle 402 to penetrate only orifices that are adjacent to overheating rack-mounted servers.

Returning now to FIG. 2, note that in one embodiment the cold air plenums 208*a*-208*b* are bypassed through the use of a flexible hose 218, which takes cold air directly from the cold air source 210 to the cold air trolleys (e.g., cold air trolley 212*a*, as depicted). In this embodiment, the expandable tube of flexible memory material 408 remains expanded at all times that the cold air source 210 is turned on, and the system moves the cold air trolley 212*a* to which ever rack-mounted server is overheating. If none of the rack-mounted servers 202*a*-202*p* is overheating, then the cold air source 210 is turned off.

Figure 6:
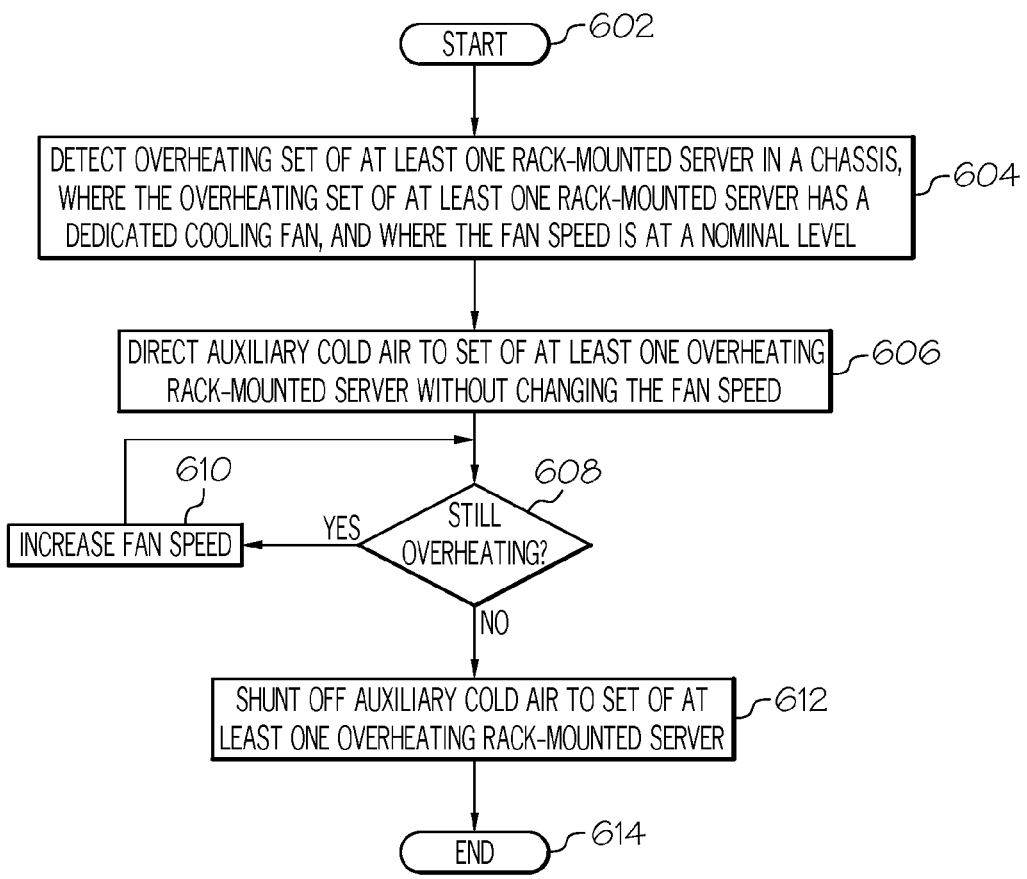
FIG. 6 is a high level flow chart of one or more exemplary steps taken by a processor to provide selective additional cooling to an overheating rack-mounted server within a chassis.

With reference now to FIG. 6, a high level flow chart of one or more exemplary steps taken by a processor to provide selective additional cooling to an overheating rack-mounted server within a chassis is presented. After initiator block 602, overheating is detected in a set of at least one rack-mounted server in a chassis, where the overheating set of at least one rack-mounted server has a dedicated cooling fan, and where the fan speed is at a nominal level (block 604). That is, one or more processors receives a thermal reading from a set of at least one thermal sensor coupled to each rack-mounted server in a chassis, wherein the set of at least one thermal sensor communicates a real time temperature of each rack-mounted server from the multiple rack-mounted servers to the chassis manager. This enables one or more processors (e.g., within the chassis manager 216 depicted in FIG. 2) to detect that a particular overheating rack-mounted server from the multiple rack-mounted servers is exceeding a predetermined temperature.

As described in block 606, auxiliary cold air (e.g., from the cold air plenums depicted in FIG. 2) is then directed to the overheating rack-mounted server, while not changing the fan speed of any fans that are dedicated to cooling that overheating rack-mounted server. If the overheating rack-mounted server is still overheating (query block 608), even after the auxiliary cold air from the cold air plenum is sent to the overheating rack-mounted server, then the fan speed is increased (block 610). However, if the previously overheating rack-mounted server is now operating within its nominal (e.g., normal) temperature range (query block 608), then the auxiliary cold air (e.g., from the cold air plenum depicted herein) is shunted off from that rack-mounted server (block 612), and the process ends (terminator block 614).

Thus, in response to the chassis manager detecting an overheating rack-mounted server, one or more processors directs mechanical means (e.g., pulleys, motors, etc.) to reposition a cold air trolley to the particular overheating rack-mounted server. As described herein, the cold air trolley is movably mounted on a trolley track that is oriented functionally proximate to the multiple rack-mounted servers, wherein the trolley track is functionally proximate if oriented in a position that allows cold air trolleys to selectively deliver cold air to the multiple rack-mounted servers. Thus, the cold air trolley moves along the trolley track in order to be selectively oriented next to a particular overheating rack-mounted server in the chassis. This allows the cold air trolley to provide a fluid conduit from a cold air source to the particular rack-mounted server in response to the chassis manager detecting that the particular overheating rack-mounted server is exceeding a predetermined temperature. Note that the term "fluid" is defined as a non-solid material capable of flowing, such as a liquid or a gas. In one embodiment of the present disclosure, "fluid" refers to a gas, such as atmospheric air.

In one embodiment, one or more processors direct a nozzle on the cold air trolley to penetrate a flexible occlusion flap that is covering an orifice in a side of a cold air plenum. As described herein, the nozzle extends away from the cold air trolley, and cold air passes through the nozzle and across the particular overheating rack-mounted server.

In one embodiment, one or more processors (e.g., part of chassis manager 216 depicted in FIG. 2) direct a pinion gear to move the nozzle through the orifice in the side of the cold air plenum. This pinion gear is mechanically coupled to a rack that is connected to the nozzle; a motor is mechanically coupled to the pinion gear; and the rack, pinion gear and motor provide linear movement to the nozzle for penetration through the flexible occlusion flap.

In one embodiment, at least one cooling fan is dedicated to a set of rack-mounted servers that includes the particular overheating rack-mounted server, and the cooling fan(s) nominally operates at a predetermined speed. In this embodiment, in response to the cold air delivered via the cold air trolley being able to bring the particular overheating rack-mounted server below the predetermined temperature, one or more processors (e.g., part of chassis manager 216 depicted in FIG. 2) prevent the cooling fan(s) from increasing their nominal/predetermined speed.

In one embodiment, one or more processors (e.g., part of chassis manager 216 depicted in FIG. 2) direct the cold air trolley to deliver the cold air to the particular overheating rack-mounted server from the cold air plenum via a flexible hose that is mechanically connected to the cold air trolley.

In one embodiment, one or more processors (e.g., part of chassis manager 216 depicted in FIG. 2) direct a cool air source to provide cooling air to the multiple rack-mounted servers via a cool air plenum, wherein the cool air plenum is in fluid communication with the cool air source, and wherein the cool air plenum is oriented adjacent to the multiple rack-mounted servers. In this embodiment, the cool air plenum provides a primary source of cooling air to the multiple rack-mounted servers, and the cold air plenum provides a secondary source of cooling air to the multiple rack-mounted servers.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

Having thus described embodiments of the disclosure of the present application in detail and by reference to illustrative embodiments thereof, it will be apparent that modifications and variations are possible without departing from the scope of the disclosure defined in the appended claims.

What is claimed is:

1. A system for selectively cooling a set of at least one rack-mounted server in a chassis, the system comprising:
    a chassis, wherein the chassis comprises racks to hold multiple rack-mounted servers;
    a chassis manager, wherein the chassis manager is a processor-based computing system;
    a set of at least one thermal sensor coupled to each rack-mounted server in the chassis, wherein the set of at least one thermal sensor communicates a real time temperature of each rack-mounted server from the multiple rack-mounted servers to the chassis manager;
    a trolley track oriented functionally proximate to the multiple rack-mounted servers, wherein the trolley track is functionally proximate if oriented in a position that allows cold air trolleys to selectively deliver cold air to the multiple rack-mounted servers;
    a cold air trolley movably mounted to the trolley track, wherein the cold air trolley moves along the trolley track in order to be selectively oriented next to a particular overheating rack-mounted server in the chassis, and wherein the cold air trolley provides a fluid conduit from a cold air source to the particular overheating rack-mounted server in response to the chassis manager detecting that the particular overheating rack-mounted server is exceeding a predetermined temperature;
    a cold air plenum in fluid communication with the cold air source;
    an orifice in a side of the cold air plenum;
    a flexible occlusion flap over the orifice; and
    a nozzle coupled to and extending away from the cold air trolley, wherein the nozzle is capable of penetrating the flexible occlusion flap to pass through the orifice, wherein cold air passes through the nozzle and across the particular overheating rack-mounted server.

2. The system of claim 1, further comprising:
    an expandable tube of flexible memory material coupled to the cold air trolley, wherein the expandable tube inflates with the cold air from the cold air plenum to expose directional holes, and wherein the directional holes direct the cold air across a predetermined area of the particular overheating rack-mounted server.

3. The system of claim 1, further comprising:
a fluid moving fan within the cold air trolley, wherein the fluid moving fan pulls the cold air from the cold air plenum.

4. The system of claim 1, further comprising:
a rack connected to the nozzle;
a pinion gear mechanically coupled to the rack; and
a motor mechanically coupled to the pinion gear, wherein the rack, pinion gear and motor provide linear movement to the nozzle for penetration through the flexible occlusion flap.

5. The system of claim 1, further comprising:
at least one cooling fan dedicated to a set of rack-mounted servers that includes the particular overheating rack-mounted server, wherein the at least one cooling fan nominally operates at a predetermined speed, wherein the at least one cooling fan is prevented by the chassis manager from increasing the predetermined speed unless a determination is made that the cold air is unable to bring the particular overheating rack-mounted server below the predetermined temperature.

6. The system of claim 1, further comprising:
a flexible hose that directs cold air from the cold air source to the particular overheating rack-mounted server via the cold air trolley.

7. The system of claim 1, further comprising:
a cold air plenum in fluid communication with the cold air source;
a cool air source; and
a cool air plenum in fluid communication with the cool air source, wherein the cool air plenum is oriented adjacent to the multiple rack-mounted servers, wherein the cool air plenum provides a primary source of cooling air to the multiple rack-mounted servers, and wherein the cold air plenum provides a secondary source of cooling air to the multiple rack-mounted servers.

8. A method of selectively cooling a set of at least one rack-mounted server in a chassis, the method comprising:
receiving, by one or more processors, a thermal reading from a set of at least one thermal sensor coupled to each rack-mounted server in the chassis, wherein the set of at least one thermal sensor communicates a real time temperature of each rack-mounted server from multiple rack-mounted servers to a chassis manager, wherein the chassis manager is a processor-based computing system;
detecting, by one or more processors, that a particular overheating rack-mounted server from the multiple rack-mounted servers is exceeding a predetermined temperature;
repositioning, by one or more processors, a cold air trolley next to the particular overheating rack-mounted server, wherein the cold air trolley is movably mounted on a trolley track that is oriented functionally proximate to the multiple rack-mounted servers, wherein the trolley track is functionally proximate if oriented in a position that allows cold air trolleys to selectively deliver cold air to the multiple rack-mounted servers, wherein the cold air trolley moves along the trolley track in order to be selectively oriented next to the particular overheating rack-mounted server in the chassis, and wherein the cold air trolley provides a fluid conduit from a cold air source to the particular overheating rack-mounted server, via a cold air plenum that is in fluid communication with the cold air source, in response to the chassis manager detecting that the particular overheating rack-mounted server is exceeding the predetermined temperature; and
directing, by one or more processors, a nozzle to penetrate a flexible occlusion flap that is covering an orifice in a side of the cold air plenum, wherein the nozzle is coupled to and extends away from the cold air trolley, and wherein cold air passes through the nozzle and across the particular overheating rack-mounted server.

9. The method of claim 8, further comprising:
directing, by one or more processors, a pinion gear to move the nozzle through the orifice in the side of the cold air plenum, wherein the pinion gear is mechanically coupled to a rack that is connected to the nozzle, wherein a motor is mechanically coupled to the pinion gear, and wherein the rack, pinion gear and motor provide linear movement to the nozzle for penetration through the flexible occlusion flap.

10. The method of claim 8, wherein at least one cooling fan is dedicated to a set of rack-mounted servers that includes the particular overheating rack-mounted server, wherein the at least one cooling fan nominally operates at a predetermined speed, and wherein the method further comprises:
in response to the cold air delivered via the cold air trolley being able to bring the particular overheating rack-mounted server below the predetermined temperature, preventing, by one or more processors, the at least one cooling fan from increasing the predetermined speed.

11. The method of claim 8, further comprising:
directing, by one or more processors, the cold air trolley to deliver the cold air to the particular overheating rack-mounted server from the cold air source via a flexible hose that is mechanically connected to the cold air trolley.

12. The method of claim 8, further comprising:
directing, by one or more processors, a cool air source to provide cooling air to the multiple rack-mounted servers via a cool air plenum, wherein the cool air plenum is in fluid communication with the cool air source, wherein the cool air plenum is oriented adjacent to the multiple rack-mounted servers, wherein the cool air plenum provides a primary source of cooling air to the multiple rack-mounted servers, and wherein the cold air plenum provides a secondary source of cooling air to the multiple rack-mounted servers.

13. A computer program product for selectively cooling a set of at least one rack-mounted server in a chassis, the computer program product comprising:
one or more computer-readable storage devices and program instructions stored on at least one of the one or more non-transitory computer-readable storage devices, the program instructions comprising:
program instructions to receive a thermal reading from a set of at least one thermal sensor coupled to each rack-mounted server in the chassis, wherein the set of at least one thermal sensor communicates a real time temperature of each rack-mounted server from multiple rack-mounted servers to a chassis manager, wherein the chassis manager is a processor-based computing system;
program instructions to detect that a particular overheating rack-mounted server from the multiple rack-mounted servers is exceeding a predetermined temperature;
program instructions to reposition a cold air trolley next to the particular overheating rack-mounted server, wherein the cold air trolley is movably mounted on a trolley track that is oriented functionally proximate to the multiple rack-mounted servers, wherein the trolley track is functionally proximate if oriented in a position that allows cold air trolleys to selectively deliver cold air to the multiple rack-mounted servers, wherein the cold air trolley moves along the trolley track in order to be selectively oriented next to the particular overheating rack-mounted server in the chassis, and wherein the cold air trolley provides a fluid conduit from a cold air source to the particular overheating rack-mounted server in response to the chassis manager detecting that the particular overheating rack-mounted server is exceeding the predetermined temperature; and program instructions to direct a nozzle to penetrate a flexible occlusion flap that is covering an orifice in a side of a cold air plenum, wherein the cold air plenum is in fluid communication with the cold air source, wherein the nozzle is coupled to and extends away from the cold air trolley, and wherein cold air passes through the nozzle and across the particular overheating rack-mounted server.

14. The computer program product of claim 13, further comprising program instructions stored on at least one of the one or more computer-readable storage devices to:

direct a pinion gear to move the nozzle through the orifice in the side of the cold air plenum, wherein the pinion gear is mechanically coupled to a rack that is connected to the nozzle, wherein a motor is mechanically coupled to the pinion gear, and wherein the rack, pinion gear and motor provide linear movement to the nozzle for penetration through the flexible occlusion flap.

15. The computer program product of claim 13, wherein at least one cooling fan is dedicated to a set of rack-mounted servers that includes the particular overheating rack-mounted server, wherein the at least one cooling fan nominally operates at a predetermined speed, and wherein the computer program product further comprises program instructions stored on at least one of the one or more computer-readable storage devices to:

in response to the cold air delivered via the cold air trolley being able to bring the particular overheating rack-mounted server below the predetermined temperature, prevent the at least one cooling fan from increasing the predetermined speed.

16. The computer program product of claim 13, further comprising program instructions stored on at least one of the one or more computer-readable storage devices to:

direct the cold air trolley to deliver the cold air to the particular overheating rack-mounted server from the cold air source via a flexible hose that is mechanically connected to the cold air trolley.

17. The computer program product of claim 13, wherein a cold air plenum is in fluid communication with the cold air source, and wherein the computer program product further comprises program instructions stored on at least one of the one or more computer-readable storage devices to:

direct a cool air source to provide cooling air to the multiple rack-mounted servers via a cool air plenum, wherein the cool air plenum is in fluid communication with the cool air source, wherein the cool air plenum is oriented adjacent to the multiple rack-mounted servers, wherein the cool air plenum provides a primary source of cooling air to the multiple rack-mounted servers, and wherein the cold air plenum provides a secondary source of cooling air to the multiple rack-mounted servers.

* * * * *